(12) United States Patent
Yunus

(10) Patent No.: US 6,933,173 B2
(45) Date of Patent: Aug. 23, 2005

US006933173B2

(54) METHOD AND SYSTEM FOR FLIP CHIP PACKAGING

(75) Inventor: Mohammad Yunus, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 167 days.

(21) Appl. No.: 10/448,843

(22) Filed: May 30, 2003

(65) Prior Publication Data

US 2004/0238402 A1 Dec. 2, 2004

(51) Int. Cl.[7] .......................... H01L 21/48; H01L 21/50
(52) U.S. Cl. ................. 438/110; 438/108; 438/113; 438/127
(58) Field of Search ............................... 438/106, 107, 438/108, 110, 112, 113, 127, 460, 462; 257/678, 778, 787

(56) References Cited

U.S. PATENT DOCUMENTS 6,459,144 B1 * 10/2002 Pu et al. ..................... 257/667
6,696,764 B2 *  2/2004 Honda ........................ 257/778

* cited by examiner

*Primary Examiner*—Ha Tran Nguyen
*Assistant Examiner*—Scott B. Geyer
(74) *Attorney, Agent, or Firm*—Yingsheng Tung; Wade James Brady, III; Frederick J. Telecky, Jr.

(57) ABSTRACT

According to one embodiment of the invention, a method of packaging flip chips includes providing a plurality of flip chips and a panel, forming a plurality of partitions outwardly from the panel, coupling the flip chips to the panel such that each partition surrounds a respective flip chip, and forming an underfill region between each of the flip chips and the panel. Each partition prevents a respective underfill region from engaging an adjacent underfill region.

17 Claims, 1 Drawing Sheet

METHOD AND SYSTEM FOR FLIP CHIP PACKAGING

TECHNICAL FIELD OF THE INVENTION

This invention relates generally to the field of integrated circuit packaging and, more specifically, to a method and system for high density, low-cost, flip chip packaging.

BACKGROUND OF THE INVENTION

Flip chip packaging is generally more expensive than wire bond packaging. Flip chip packaging may result, however, in a continuous layer of underfill between the flip chip and the substrate due to underfill backflow reasons. In order to singulate the packages, the continuous layer of underfill must be sawn through, which may cause numerous problems, such as poor reliability due to moisture ingress, nascent cracks, and delamination.

SUMMARY OF THE INVENTION

According to one embodiment of the invention, a method of packaging flip chips includes providing a plurality of flip chips and a panel, forming a plurality of partitions outwardly from the panel, coupling the flip chips to the panel such that each partition surrounds a respective flip chip, and forming an underfill region between each of the flip chips and the panel. Each partition prevents a respective underfill region from engaging an adjacent underfill region.

Some embodiments of the invention provide numerous technical advantages. Other embodiments may realize some, none, or all of these advantages. For example, complications due to singulating the packages is substantially reduced by utilizing partitions on the periphery of the flip chip packages to prevent underfill backflow and excess flow. This significantly increases reliability and decreases the potential for underfill peel off, in addition to extending the life of the saw blade for singulation. The underfill dispensing process may also be made easier by the use of the partitions.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1A through 1F of the drawings, in which like numerals refer to like parts.

FIGS. 1A through 1F are a series of cross-sectional elevation views illustrating an example method of packaging a plurality of flip chips 100 (FIG. 1C) in accordance with an embodiment of the present invention. Flip chip packaging is generally more expensive than wire bond packaging. Therefore, one way to reduce the cost of flip chip packaging is to package a high number of closely spaced flip chips on a given panel or substrate. In the example illustrated in FIG. 1A, a panel 102 may be used to package a plurality of closely spaced flip chips, such as flip chips 100.

Panel 102, in one embodiment, is a glass-fiber-reinforced epoxy resin, such as FR4; however, panel 102 may be formed from other suitable materials. For example, panel 102 may be formed from thinner substrates, such as polyimide or ceramic film substrates for high temperature applications, or formed from thicker substrates, such as multilayer substrates (i.e., laminates). In one embodiment, panel 102 is rectangularly shaped with dimensions approximately ten inches wide by twelve inches long; however, panel 102 may have any suitable shape and any suitable size. Although not illustrated in any of FIGS. 1A through 1F, panel 102 typically has one or more conductive paths formed therein.

Because a high number of flip chips 100 are desired to be formed on panel 102, very little space will exist between adjacent flip chips 100 so that maximum panel 102 utilization may be achieved. This causes some constraints on the assembly process since it results in a continuous layers of underfill between flip chips 100 and panel 102 due to underfill back flow reasons. In order to singulate flip chips 100, the continuous layer of underfill must be sawed through, which may cause numerous problems, such as poor reliability due to moisture ingress, nascent cracks, and delamination. Therefore, according to the teachings of one embodiment of the present invention, the formation of a continuous underfill layer is avoided by the use of a plurality of partitions 104, as illustrated below in FIG. 1B.

Figure 1A:
FIGS. 1A through 1F are a series of cross-sectional elevation views illustrating an example method of packaging flip chips in accordance with an embodiment of the invention.
Figure 1B:
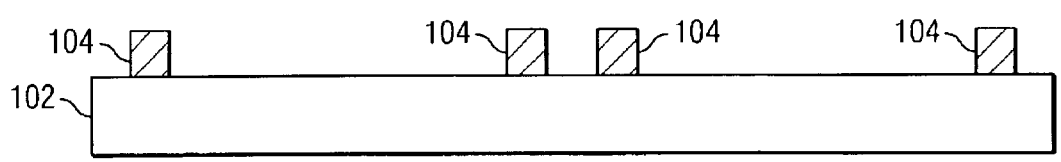

FIG. 1B illustrates partitions 104 formed outwardly from panel 102. Partitions 104 may be formed from any suitable material and may be formed using any suitable technique. For example, partitions 104 may be formed from a metal, such as copper, or may be formed from a polymer or other suitable material. Some examples of forming techniques are electroplating, patterning and etching, stamping, forging or any other suitable additive or subtractive technique. Partitions 104 may also be any suitable size and shape. For example, each partition 104 may have a height between approximately twenty-five and seventy-five microns, and a width between approximately twenty-five and one hundred twenty-five microns. Partitions 104 may additionally be formed on panel 102 in any suitable pattern. Typically, partitions 104 are formed on panel 102 in the form of squares or rectangles on panel 102 in order to match the general shape of flip chips 100.

Figure 1C:
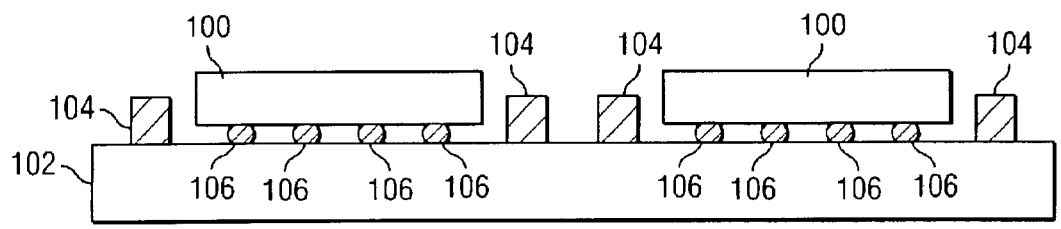

FIG. 1C illustrates a pair of flip chips 100 coupled to panel 102 using standard flip-chip technology. In this embodiment, flip chips 100 each have a plurality of solder bumps 106 coupled to one of its sides. Solder bumps 106 are formed on flip chips 100 so that solder bumps 106 match up with a plurality of solder pads (not exclusively shown) on panel 102 for attachment. Standard reflow technology, which is well known in the art of semiconducting manufacturing, may then be used to melt solder bumps 106 so that strong bonds are formed with the solder pads on panel 102. Other suitable attachment techniques may be utilized to couple flip chips 100 to panel 102. After coupling flip chips 100 to panel 102, gaps exist between flip chips 100 and panel 102 because of the use of solder bumps 106. These gaps may be filled using an underfill technique, as described below in conjunction with FIG. 1D, or by other suitable methods.

Figure 1D:
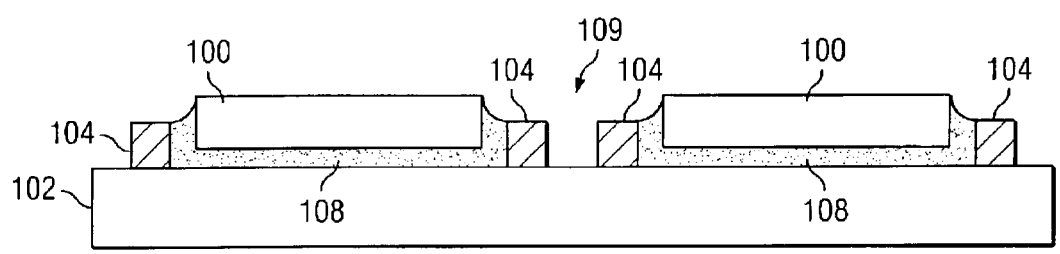

FIG. 1D illustrates an underfill region 108 formed between each flip chip 100 and panel 102. In one embodiment, the material used to form underfill regions 108 is an epoxy; however, underfill regions 108 may be formed from other suitable types of material in order to fill in the gaps that exist between flip chips 100 and panel 102. Underfill regions 108 are used to enhance the bond of flip chips 100 to panel 102 and to provide better reliability by reducing the stresses from the joining of solder bumps 106 to the solder pads on panel 102.

As described above, partitions 104 prevent the formation of a continuous underfill layer between flip chips 100 and panel 102 and facilitate the formation of underfill regions 108. Accordingly, this creates vacant areas (non-underfilled areas) between adjacent flip chip 100, as illustrated in FIG. 1D by a gap 109 between partitions 104 that exist between the illustrated flip chips 100. As described in further detail below, gap 109 is where a cutting device is utilized in order to singulate the completed packages after the assembly process. Gap 109 may have any suitable width; however, in one embodiment, gap 109 has a width of at least 0.1 mm. The type of cutting device used to singulate the completed packages may determine the width of gap 109 between partitions 104.

Figure 1E:
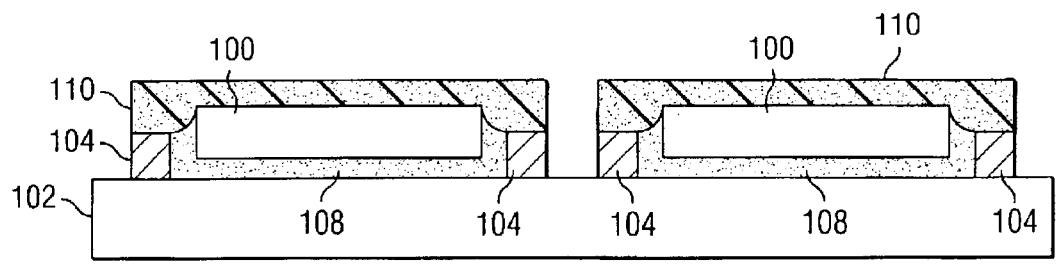

FIG. 1E illustrates flip chips 100 encapsulated by a molding 110 in accordance with an embodiment of the present invention. Molding 110, in one embodiment, is an epoxy material; however, molding 110 may be other types of thermosetting plastics, thermoplastics, or other types of materials suitable for encapsulating flip chips 100 and protecting them from contaminants and harsh environments. In lieu of molding 110, other suitable techniques may be used to encapsulate flip chips 100 to protect them from the environment, such as enclosure lids.

Figure 1F:
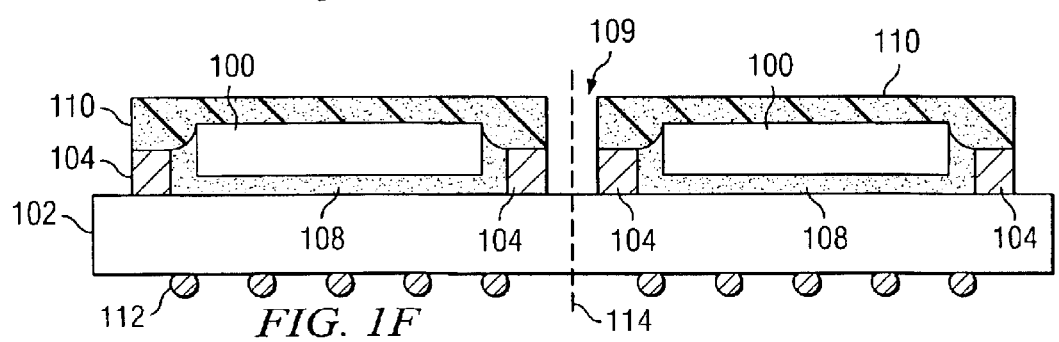

FIG. 1F illustrates a plurality of solder balls 112 coupled to a surface of panel 102 opposite flip chips 100. In one embodiment, solder balls 112 are 0.5 mm diameter metal solder balls made of a combination of tin and lead; however, solder balls 112 may be formed with other suitable diameters and formed from other suitable materials. To complete the manufacturing of the flip chip packages, such as ball grid array ("BGA") packages, the flip chip packages have to be singulated by utilizing a cutting device (not shown) that cuts through panel 102 as illustrated by dashed line 114 in FIG. 1F. As described above, the cutting device utilized is placed within gap 109 in order to singulate the packages. This then ends the example method as illustrated in FIGS. 1A through 1F.

Thus, complications due to singulating the packages is substantially reduced by utilizing partitions on the periphery of the flip chips that prevent underfill backflow and excess flow of the underfill. This significantly increases the reliability of the flip chip packages and decreases the potential for underfill peel off, in addition to extending the life of the cutting device used for singulation.

Although embodiments of the invention and their advantages are described in detail, a person skilled in the art could make various alterations, additions, and omissions without departing from the spirit and scope of the present invention, as defined by the appended claims.

What is claimed is:

1. A method of packaging flip chips, comprising:
   providing a plurality of flip chips and a panel;
   forming a plurality of partitions outwardly from the panel, with a height between approximately 25 and 75 microns and a width between approximately 25 and 125 microns;
   coupling the flip chips to the panel such that each partition surrounds a respective flip chip; and
   forming an underfill region between each of the flip chips and the panel, whereby each partition prevents a respective underfill region from engaging an adjacent underfill region.

2. The method of claim 1, further comprising forming the partitions from a metal.

3. The method of claim 1, further comprising forming the partitions from a polymer.

4. The method of claim 1, further comprising:
   encapsulating each flip chip with a molding; and
   coupling a plurality of solder balls to a surface of the panel opposite the flip chips.

5. The method of claim 1, further comprising forming the partitions such that a gap between any adjacent partitions is at least 0.1 millimeters.

6. A method of packaging flip chips, comprising:
   providing a plurality of flip chips and a panel;
   forming a plurality of partitions outwardly from the panel;
   coupling the flip chips to the panel such that any two adjacent flip chips have two respective partitions between them, the two respective partitions being separated by a gap with a width of at least 0.1 millimeters;
   forming an underfill region between each of the flip chips and the panel such that any two adjacent underfill regions are separated by at least the gap; and
   directing a cutting device between the respective partitions to singulate the flip chips.

7. The method of claim 6, wherein directing the cutting device comprises directing a saw blade.

8. The method of claim 6, further comprising forming the partitions from a metal.

9. The method of claim 6, further comprising forming the partitions from a polymer.

10. The method of claim 6, further comprising:
    encapsulating each flip chip with a molding; and
    coupling a plurality of solder balls to a surface of the panel opposite the flip chips.

11. The method of claim 6, further comprising forming the partitions with a height between approximately 25 and 75 microns and a width between approximately 25 and 125 microns.

12. A system for packaging flip chips, comprising:
    a plurality of flip chips coupled to a panel;
    a plurality of partitions formed outwardly from the panel with a height between approximately 25 and 75 microns and a width between approximately 25 and 125 microns, each partition surrounding a respective flip chip;
    a plurality of underfill regions formed outwardly from the panel, each underfill region disposed between a respective flip chip and the panel; and
    whereby each partition prevents a respective underfill region from engaging an adjacent underfill region.

13. The system of claim 12, further comprising a cutting device operable to singulate the flip chips, the cutting device configured to singulate the flip chips between adjacent partitions.

14. The system of claim 12, wherein partitions are formed from a metal.

15. The system of claim 12, wherein the partitions are formed from a polymer.

16. The system of claim 12, further comprising:
    a molding configured to encapsulate each flip chip; and
    a plurality of solder balls coupled to a surface of the panel opposite the flip chips.

17. The system of claim 12, wherein the partitions are formed on the panel such that a gap between any adjacent partitions is at least 0.1 millimeters.

* * * * *